US012745631B2

(12) United States Patent
Boutaleb et al.

(10) Patent No.: US 12,745,631 B2
(45) Date of Patent: Sep. 22, 2026

(54) INTEGRATED CIRCUIT PACKAGE

(71) Applicant: STMicroelectronics (Grenoble 2) SAS, Grenoble (FR)

(72) Inventors: Younes Boutaleb, Grenoble (FR); Julien Cuzzocrea, Montbonnot Saint Martin (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 1065 days.

(21) Appl. No.: 17/884,980

(22) Filed: Aug. 10, 2022

(65) Prior Publication Data

US 2023/0060870 A1 Mar. 2, 2023

(30) Foreign Application Priority Data

Aug. 27, 2021 (FR) .................................... 2108970

(51) Int. Cl.
*H10W 40/22* (2026.01)
*H10W 74/10* (2026.01)

(52) U.S. Cl.
CPC ........ *H10W 40/226* (2026.01); *H10W 74/117* (2026.01)

(58) Field of Classification Search
None
See application file for complete search history.

(56) References Cited

U.S. PATENT DOCUMENTS 5,108,955 A * 4/1992 Ishida ................. H01L 23/4334 249/97
5,247,426 A 9/1993 Hamburgen et al.
6,400,014 B1 * 6/2002 Huang ................ H01L 23/4334 257/E23.092
7,898,093 B1 3/2011 Darveaux et al.
2015/0357261 A1 * 12/2015 Tsuji ....................... C08L 83/06 252/75

FOREIGN PATENT DOCUMENTS

CN 112103259 A 12/2020
CN 218498056 U 2/2023

OTHER PUBLICATIONS

INPI Search Report and Written Opinion for priority application, FR 2108970, report dated 8 pgs.
CN First Office Action and Search Report for counterpart CN Appl. No. 202211035799.9, report dated Jan. 23, 2026, 9 pgs.

* cited by examiner

*Primary Examiner* — Bradley Smith
(74) *Attorney, Agent, or Firm* — Crowe & Dunlevy LLC

(57) ABSTRACT

An integrated circuit package includes a base substrate with at least one electronic chip mounted on a face of the base substrate. The electronic chip is configured to have hot spots in operation emitting heat in a heat volume space. A coating encapsulates the at least one electronic chip. The coating has a bottom face mounted on the face of the base substrate and a profiled top face. A portion of the profile top face is configured to locally reduce a volume of a region of the coating. The portion is located at least in part in the heat volume space. A heat sink is mounted on the profiled top face of the coating using a mounting layer.

16 Claims, 3 Drawing Sheets

INTEGRATED CIRCUIT PACKAGE

PRIORITY CLAIM

This application claims the priority benefit of French Application for Patent No. 2108970, filed on Aug. 27, 2021, the content of which is hereby incorporated by reference in its entirety to the maximum extent allowable by law.

TECHNICAL FIELD

Implementations and embodiments relate to the field of microelectronics and, in particular, to the field of integrated circuit packaging and, more particularly, to the heat dissipation of integrated circuit packages.

BACKGROUND

Conventionally, a type of integrated circuit package includes at least one electronic integrated circuit chip disposed on a face of a base substrate and protected by a coating, typically a resin, molded around the chip and rigidly connected to the base substrate. The other face of the base substrate can include electrical connection structures, for example balls, intended to be mounted on a printed circuit board (PCB).

This coating resin makes it possible not only to protect the chip but also to contribute to the robustness of the package.

There is a need in the art to enhance the heat dissipation of this type of package.

SUMMARY

The inventors have observed that the resin is a weak point in the heat dissipation capacity of the package, especially when the heat released by the chip in operation is evacuated to the top of the package (i.e., the opposite of the base substrate).

It is therefore proposed to reduce locally at suitable locations, the thickness of the coating resin to reduce the thermal chain of the package so as to maintain, when the electronic chip is in operation, a maximum junction temperature which does not degrade the integrated circuit, while retaining a sought robustness for the package.

According to an aspect, an integrated circuit package is proposed, comprising a base substrate, at least one electronic chip mounted on a face of the base substrate and configured to have hot spots in operation emitting heat in a heat volume space, for example a volume space delimited by a truncated type surface.

The package also includes a coating which coats at least said at least one electronic chip and, optionally, electrical connection wires soldered between the chip and the base substrate ("wire bonding").

The coating has a bottom face mounted on said face of the base substrate and a profiled top face having a portion of the profile thereof configured to reduce the volume of a region of the coating.

Said portion of the profile is located at least partially in the heat volume space.

The package also includes a heat sink, generally metallic, mounted on the profiled top face of the coating by a mounting layer, for example a layer of adhesive or a layer of an interface material, preferably heat conducting, well-known to a person skilled in the art.

Thus, reducing the thickness of the coating resin inside the heat volume space makes it possible to enhance the heat dissipation of the package by reducing the quantity of resin which is the weak point of the thermal chain, while retaining the robustness of the package as the thickness of the resin is preserved where the heat dissipation is lower, or even negligible.

According to a possible alternative embodiment, the mounting layer has a profile molding (i.e., conforming to) the profiled top face of the coating and the heat sink includes a profiled bottom face molding (i.e., conforming to) the profile of the mounting layer and a planar top face.

According to a further possible alternative embodiment, the mounting layer has a profiled bottom face molding (i.e., conforming to) the profiled top face of the coating and a planar top face, and the heat sink has a planar bottom face mounted on the planar top face of the mounting layer and a planar top face.

The heat volume space varies in size according to the size of the chip.

A person skilled in the art will know how to adapt the profile of the top face of the coating according to the size of the chip, the operating hot spots thereof and the sought heat dissipation enhancement.

Thus, according to an embodiment, the portion of the profile for the profiled top face of the coating includes at least a first hollowed zone extending in the direction of the base substrate and delimiting at least a first portion of the reduced region of the coating at least partially covering said at least one chip.

It is also possible that the portion of the profile for the profiled top face of the coating includes at least a second hollowed zone extending in the direction of the base substrate and delimiting at least a second portion of the reduced region of the coating located laterally in relation to the first portion of the reduced region of the coating.

The package can be of the type using "wire bonding" technology. In this case, said at least one chip includes a bottom face mounted on said base substrate face by a layer of adhesive and a top face including contact pads electrically connected to the face of the base substrate by connection wires.

The coating then also coats the contact pads and the connection wires.

Alternatively, the package can be of the type using so-called "flip chip" technology. In this case, the chip includes a bottom face equipped with electrically conductive connection balls mounted on said face of the substrate and embedded in an "underfill" layer.

BRIEF DESCRIPTION OF THE DRAWINGS

Further advantages and features of the invention will become apparent on studying the detailed description of embodiments and implementations, in no way restrictive, and of the appended drawings wherein.

DETAILED DESCRIPTION

Figure 1:
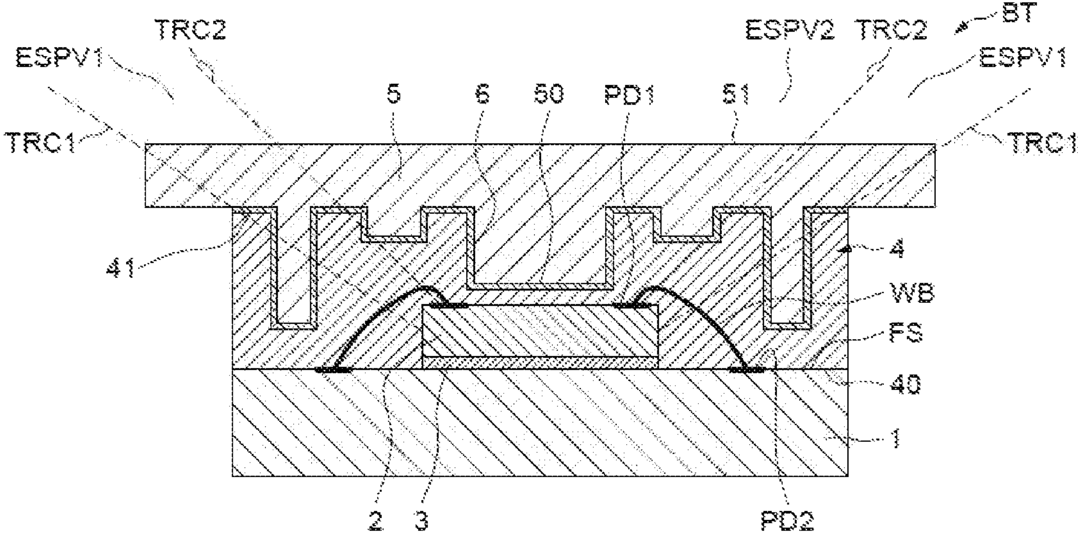
FIG. 1 schematically illustrates a sectional view of an integrated circuit package.

FIG. 1 schematically illustrates a sectional view of an integrated circuit package BT according to an embodiment. The package BT comprises a base substrate 1 and at least one electronic integrated circuit chip 2 mounted on a top mounting face FS of the base substrate 1. The package BT can also comprise several other electronic chips.

That being said, for simplification purposes, in the embodiments described here, a single chip 2 is represented.

In operation, the electronic chip 2 has hot spots. These hot spots emit heat in a heat volume space.

According particularly to the size of the chip 2, the hot spots can be more or less substantial and/or spaced and hence the heat volume space can vary in size.

By way of example, two heat volume spaces ESPV1 and ESPV2 are shown. The volume space ESPV1 represents more particularly a larger space than the space ESPV2, corresponding to a greater emission of heat. By way of example, the heat volume spaces ESPV1 and ESPV2 can be respectively delimited by truncated type surfaces TRC1 and TRC2 broadening from the chip in the direction of heat evacuation. In this case, the heat is evacuated at the top of the package, opposite the base substrate 1.

Hereinafter, the referenced heat volume space will be the space ESPV1.

The package is in this embodiment of the type using "wire bonding" technology. In this case, the electronic chip 2 includes a bottom face mounted on the face FS of the base substrate 1 by an adhesive layer 3 and a top face.

The top face of the electronic chip 2 includes contact pads PD1 electrically connected to contact pads PD2 of the face FS of the base substrate 1 by connection wires WB soldered on these pads.

The integrated circuit package BT further comprises a coating 4. The coating 4 coats (embeds or encapsulates) at least the electronic chip 2 and here also the electrically conductive connection wires WB as well as the different contact pads PD1, PD2.

The coating 4 can also coat any other electronic chips of the package BT.

The coating 4 can be resin for example. The resin has advantageous mechanical properties enabling the package BT to withstand the mechanical stress liable to be applied thereon. The use of such a coating 4 particularly contributes to the robustness of the package BT.

Moreover, this coating 4 has a bottom face 40 and a profiled top face 41. The bottom face 40 and the profiled top face 41 thus define the thickness of the coating 4.

The bottom face 40 of the coating 4 is rigidly connected to the face FS of the base substrate 1.

The package BT also comprises a heat sink 5 and a bonding layer 6, for example but non-restrictively a thermally conductive adhesive layer 6.

The heat sink 5 is generally formed by a heat-conducting material such as metal. For example, it is possible to provide a copper heat sink 5 having a thermal conductivity of 385 W/mK. The heat sink 5 is mounted on the profiled top face 41 of the coating 4 using the thermally conductive adhesive layer 6.

The adhesive layer 6 thus makes it possible in particular to carry out a heat transfer from the coating 4 to the heat sink 5.

Figure 2:
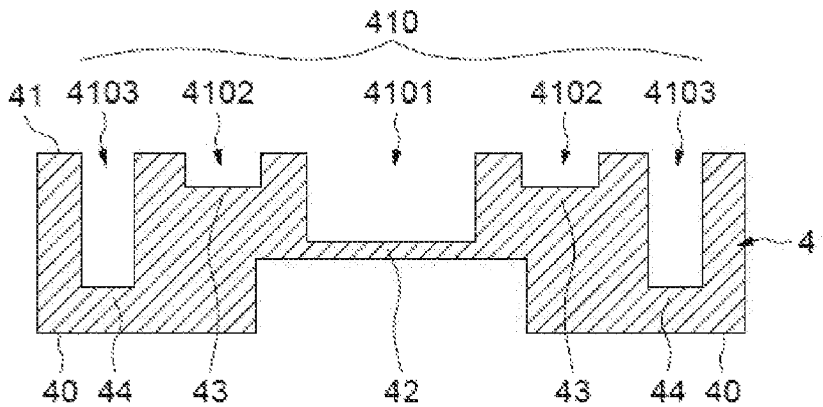
FIG. 2 specifically represents the coating of FIG. 1.

As illustrated more specifically in FIG. 2 which specifically represents the coating 4 of FIG. 1, the profiled top face 41 has a portion of the profile 410 thereof configured to locally reduce the volume of a region of the coating 4. In other words, the volume of a region of the coating 4 can be reduced at discrete intervals according to the profile of the top face 41 of the coating 4. In particular, the profile portion 410 is configured to reduce the thickness of a coating region 4.

The portion of the profile 410 is located here at least partially in the heat volume space ESPV1 and ESPV2. By locally reducing the thickness of a region of the coating 4, the thermal chain of the package BT is reduced, while retaining an overall thickness of the coating 4 needed to obtain a sought robustness for the package BT. This therefore makes it possible to maintain a maximum junction temperature which does not degrade the integrated circuit when the electronic chip 2 is in operation.

As illustrated in the sectional view in FIG. 2, the portion of the profile 410 of the profiled top face 41 of the coating 4 includes a first hollowed zone 4101. The first hollowed zone 4101 extends in the direction of the base substrate 1 and delimits a first portion 42 of the reduced region of the coating 4.

The first hollowed zone 4101 can be a trench. The first portion 42 of the reduced region of the coating 4 covers at least partially the electronic chip 2. In particular, the part of the electronic chip 2 covered by the first portion 42 includes at least some of the hot spots emitting heat in the heat volume space ESPV1 when the electronic chip 2 is in operation. In this case, the first portion 42 and the first hollowed zone 4101 can be located in the heat volume space ESPV1.

The portion of the profile 410 of the profiled top face 41 of the coating 4 includes, furthermore here, a second hollowed zone 4102. The second hollowed zone 4102 extends in the direction of the base substrate 1 and delimits at least a second portion 43 of the reduced region of the coating 4. The second hollowed region 4102 can form a trench surrounding the first portion 42 for example. The second portion 43 is located laterally in relation to the first portion 42 of the reduced region of the coating 4. In particular, at least a part of the second portion 43 and of the second hollowed zone can be located in the heat volume space ESPV1.

The second portion 43 of the reduced region of the coating 4 also helps reduce the thermal chain of the package BT in the heat volume space ESPV1.

The portion of the profile 410 of the profiled top face 41 of the coating 4 includes, furthermore here, a third hollowed zone 4103. The third hollowed zone 4103 extends in the direction of the base substrate 1 and delimits at least a third portion 44 of the reduced region of the coating 4. The third hollowed region 4103 can form a trench surrounding the second portion 43 for example. The third portion 44 is located laterally in relation to the second portion 43 of the reduced region of the coating 4. In particular, at least a part of the third hollowed zone can be located in the heat volume space ESPV1.

The third portion 44 of the reduced region of the coating 4 also helps reduce the thermal chain of the package BT in the heat volume space ESPV1.

In the scenario where the package contains a smaller electronic chip 2 emitting heat in the narrower heat volume space ESPV2, the hollowed zone 4103 can then be avoided.

A person skilled in the art will know how to define the profile of the coating according to the hot spots of the chip in operation and the sought robustness for the package.

Figure 3:
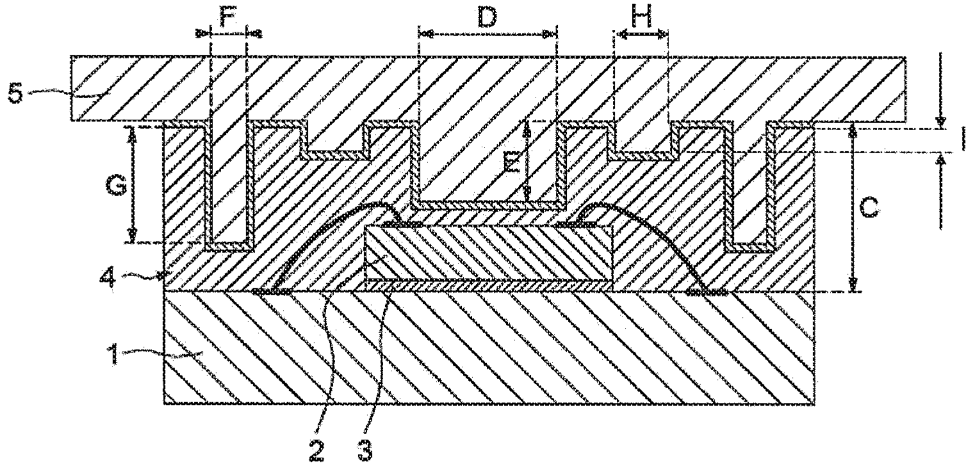
FIG. 3 schematically illustrates the package in FIG. 1 with dimensions.

By way of indication, FIG. 3 illustrates schematically the package in FIG. 1 with dimensions. A first dimension C corresponds to the thickness of the coating 4. A second dimension D and third dimension E correspond respectively to the width and to the depth of the first hollowed zone 4101 of the profile portion 410. A fourth dimension F and fifth dimension G correspond respectively to the width and to the depth of the third hollowed zone 4103 of the profile portion 410. A sixth dimension H and seventh dimension I correspond respectively to the width and to depth of the second hollowed zone 4102 of the profile portion 410.

A person skilled in the art will know how to define the dimensions of C, D, E, F, G, H and I in order to obtain a package BT capable of dissipating heat and maintaining a maximum junction temperature which does not degrade the integrated circuit when the electronic chip 2 is in operation while retaining a sought robustness for the package BT.

By way of example, a person skilled in the art can define a dimension C of 800 μm, a dimension D of value equivalent to 90% of the surface area of the electronic chip 2, a dimension E of 400 μm, a dimension F of value between 2 and 3 mm and a dimension G of 400 μm. Dimension H can be between dimension D and dimension F, and dimension I can be less than dimension E.

According to the local reductions made on the resin and according to the hot spots on the electronic chip, an enhancement of heat dissipation of the order of 20% can be observed, or more. In the embodiment in FIG. 1, the adhesive layer 6 has a profile molding (i.e., conforming to) the profiled top face 41 of the coating 4. The heat sink 5 then includes a profiled bottom face 50 and a planar top face 51. The profiled bottom face of the heat sink 5 molds (i.e., conforms to) the profile of the adhesive layer 6. In particular, the profiled bottom face 50 of the heat sink 5 forms fins adapted to be inserted in the hollowed zones 4101, 4102 and 4103 of the profile portion 410 of the coating 4.

The fins formed by the profiled bottom face 50 make it possible to increase the surface area of the heat sink 5 at the locations where the portions 42, 43 and 44 of the reduced region of the coating 4 are located and therefore enable the heat sink 5 to evacuate more heat outside the package BT.

Figure 4:
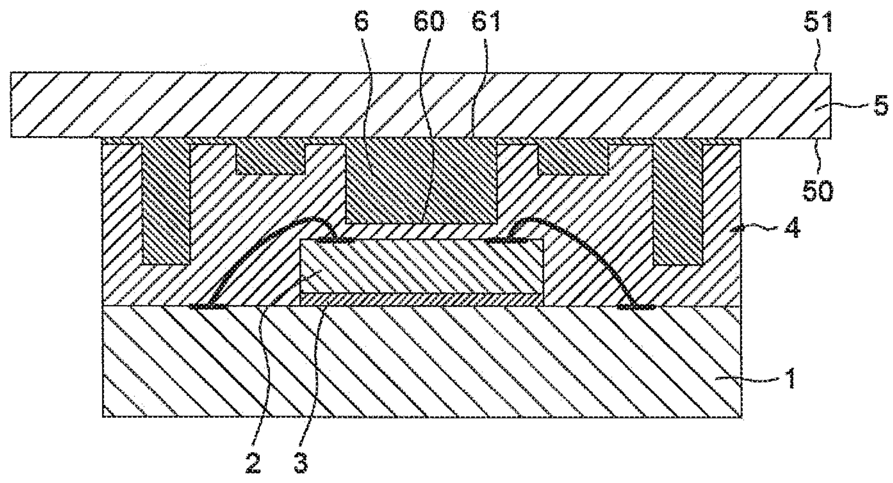
FIGS. 4-5 illustrate alternative implementations.

Alternatively as illustrated in FIG. 4, the adhesive layer 6 has a profiled bottom face 60 and a planar top face 61. The profiled bottom face 60 of the adhesive layer 6 then molds (i.e., conforms to) the profiled top face 41 of the coating 4. In particular, the adhesive layer 6 fills the hollowed zones 4101, 4102 and 4103 such that the top face 61 of the adhesive layer 6 remains planar. In the same alternative embodiment, the heat sink 5 has a planar bottom face 50 and a planar top face 51. The planar bottom face 50 of the heat sink 5 is mounted on the planar top face 61 of the adhesive layer 6.

It is therefore possible to imagine a heat sink 5 of simple geometric shape, which makes it possible particularly to simplify the manufacture of the package BT.

As illustrated in the preceding figures, the package BT uses "wire bonding" technology.

Figure 5:
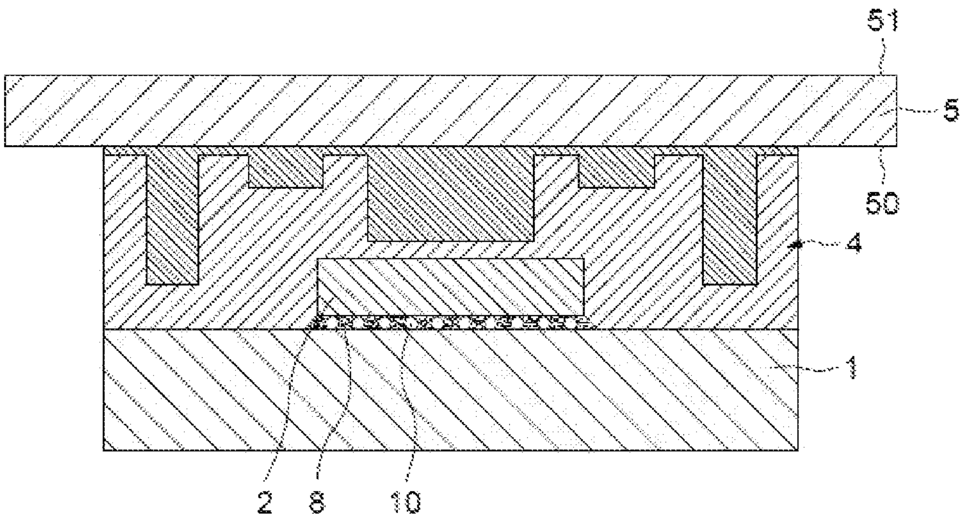

Alternatively, however as illustrated in FIG. 5, the package can be of the type using so-called "flip chip" technology. In this case, as is well-known, the chip includes a bottom face equipped with electrically conductive connection balls 10. These connection balls 10 are mounted on the face FS of the base substrate 1.

Moreover, the connection balls 10 are generally embedded in an "underfill" layer 8. The underfill layer 8 can be formed by a similar resin to that used for the coating 4.

The characteristics of the coating 4, the mounting layer 6 and the heat sink, described with reference to the above figures are applicable to the embodiment of the package in FIG. 5.

The invention claimed is:

1. An integrated circuit package, comprising:

a base substrate;

an electronic chip mounted on a face of the base substrate;

a coating which encapsulates said electronic chip, said coating having a bottom face mounted on said face of the base substrate and further having a profiled top face;

wherein a portion of said profiled top face is configured to locally reduce a volume of a region of the coating; and a heat sink mounted on the profiled top face of the coating using a mounting layer;

wherein said profiled top face is defined by:

a first hollowed zone extending in a direction of the base substrate and located vertically over said electronic chip; and a second hollowed zone extending in the direction of the base substrate, spaced laterally away from and surrounding the first hollowed zone, and at least partially located vertically over said electronic chip.

2. The package according to claim 1, wherein the mounting layer has a profile that molds to the profiled top face of the coating and wherein the heat sink has a profiled bottom face that molds to a profile of the mounting layer and further includes a planar top face.

3. The package according to claim 1, wherein the mounting layer has a profiled bottom face that molds to the profiled top face of the coating and further includes a planar top face, and wherein the heat sink has a planar bottom face mounted on the planar top face of the mounting layer and a planar top face.

4. The package according to one claim 1, wherein the first hollowed zone delimits a corresponding first locally reduced volume of the coating covering at least partially said electronic chip.

5. The package according to claim 4, wherein the second hollowed zone delimits a corresponding second locally reduced volume of the coating located laterally in relation to the first locally reduced volume of the coating.

6. The package according to claim 1, wherein said electronic chip includes a bottom face mounted on said face of the base substrate by an adhesive layer and a top face including contact pads electrically connected to contact pads of the face of the base substrate by connection wires, and wherein the coating further encapsulates the contact pads and the connection wires.

7. The package according to claim 1, wherein the electronic chip includes a bottom face equipped with electrically conductive connection balls mounted on said face of the substrate.

8. The package according to claim 1, wherein the first hollowed zone has a first depth from an upper surface of the coating and the second hollowed zone has a second depth from the upper surface of the coating, and wherein the first depth is greater than the second depth.

9. The package according to claim 8, wherein said profiled top face is further defined by a third hollowed zone extending in the direction of the base substrate and spaced laterally away from and surrounding the second hollowed zone, wherein the first hollowed zone has a first depth from an upper surface of the coating and the third hollowed zone has a third depth from the upper surface of the coating, and wherein the third depth is greater than the first depth.

10. An integrated circuit package, comprising:

a base substrate;

an electronic chip mounted on a face of the base substrate;

a coating which encapsulates said electronic chip and is mounted to said face of the base substrate and further having a profiled top face defined by a plurality of hollowed zones that locally reduce a volume of corresponding region of the coating;

a mounting layer that fills the plurality of hollowed zones and covers the coating to provide a planar top face; and a heat sink having a planar bottom face mounted on the planar top face of the mounting layer;

wherein the plurality of hollowed zones comprises a first hollowed zone extending in a direction of the base substrate and providing a first locally reduced volume of the coating which extends directly over said electronic chip;

wherein the plurality of hollowed zones further comprises a second hollowed zone extending in the direction of the base substrate and providing a second locally reduced volume of the coating located laterally in relation to the first locally reduced volume; and wherein the second locally reduced volume of the coating extends partially over said electronic chip and partially beyond an outer perimeter of said electronic chip.

11. The package according to claim 10, wherein the first hollowed zone has a depth deeper than a depth of the second hollowed zone.

12. An integrated circuit package, comprising:

a base substrate;

an electronic chip mounted on a face of the base substrate;

a coating which encapsulates said electronic chip and is mounted to said face of the base substrate and further having a profiled top face defined by a plurality of hollowed zones that locally reduce a volume of corresponding region of the coating;

a mounting layer that fills the plurality of hollowed zones and covers the coating to provide a planar top face; and a heat sink having a planar bottom face mounted on the planar top face of the mounting layer;

wherein the plurality of hollowed zones comprises a first hollowed zone extending in a direction of the base substrate and providing a first locally reduced volume of the coating which extends directly over said electronic chip;

wherein the plurality of hollowed zones further comprises a second hollowed zone extending in the direction of the base substrate and providing a second locally reduced volume of the coating located laterally in relation to the first locally reduced volume; and wherein the second locally reduced volume of the coating extends completely laterally beyond an outer perimeter of said electronic chip.

13. The package according to claim 12, wherein the second hollowed zone has a depth deeper than a depth of the first hollowed zone.

14. An integrated circuit package, comprising:

a base substrate;

an electronic chip mounted on a face of the base substrate;

a coating which encapsulates said electronic chip and is mounted to said face of the base substrate and further having a profiled top face defined by a plurality of hollowed zones that locally reduce a volume of corresponding region of the coating;

wherein said plurality of hollowed zones comprise:

a first hollowed zone extending in a direction of the base substrate and providing a first locally reduced volume of the coating which extends directly over said electronic chip; and a second hollowed zone extending in the direction of the base substrate and providing a second locally reduced volume of the coating located laterally in relation to the first locally reduced volume; and a heat sink mounted on the profiled top face of the coating using a mounting layer;

wherein the second locally reduced volume of the coating extends partially over said electronic chip and partially beyond an outer perimeter of said electronic chip.

15. The package according to claim 14, wherein the first hollowed zone has a depth deeper than a depth of the second hollowed zone.

16. An integrated circuit package, comprising:

a base substrate;

an electronic chip mounted on a face of the base substrate;

a coating which encapsulates said electronic chip and is mounted to said face of the base substrate and further having a profiled top face defined by a plurality of hollowed zones that locally reduce a volume of corresponding region of the coating;

wherein said plurality of hollowed zones comprise:

a first hollowed zone extending in a direction of the base substrate and providing a first locally reduced volume of the coating which extends directly over said electronic chip; and a second hollowed zone extending in the direction of the base substrate and providing a second locally reduced volume of the coating located laterally in relation to the first locally reduced volume; and a heat sink mounted on the profiled top face of the coating using a mounting layer;

wherein the second locally reduced volume of the coating extends completely laterally beyond an outer perimeter of said electronic chip; and wherein the second hollowed zone has a depth deeper than a depth of the first hollowed zone.

* * * * *